United States Patent

Gallagher et al.

Patent Number: 5,853,622
Date of Patent: Dec. 29, 1998

[54] TRANSIENT LIQUID PHASE SINTERING CONDUCTIVE ADHESIVES

[75] Inventors: Catherine Gallagher, San Marcos; Goran Matijasevic, San Clemente; M. Albert Capote, Carlsbad, all of Calif.

[73] Assignee: Ormet Corporation, Carlsbad, Calif.

[21] Appl. No.: 704,467

[22] Filed: Aug. 28, 1996

Related U.S. Application Data

[63] Continuation-in-part of Ser. No. 483,079, Jun. 7, 1995, Pat. No. 5,716,663, which is a continuation-in-part of Ser. No. 324,060, Oct. 17, 1994, which is a division of Ser. No. 769,892, Oct. 1, 1991, Pat. No. 5,376,403, which is a continuation-in-part of Ser. No. 477,678, Feb. 9, 1990, abandoned.

[51] Int. Cl.$^6$ ............................... H01B 1/22; C21B 3/02
[52] U.S. Cl. .......................... 252/512; 252/513; 252/514; 419/56; 75/303
[58] Field of Search .................... 252/512, 513, 252/514; 10/1.12; 419/56; 75/303

[56] References Cited

U.S. PATENT DOCUMENTS

| | | | |
|---|---|---|---|
| 2,993,815 | 7/1961 | Treptow | 117/212 |
| 3,256,109 | 6/1966 | Berger | 117/38 |
| 3,410,714 | 11/1968 | Jones | 117/46 |

(List continued on next page.)

FOREIGN PATENT DOCUMENTS

| | | |
|---|---|---|
| 1190736 | 7/1985 | Canada . |
| 239901 | 3/1987 | European Pat. Off. . |
| 237840 | 7/1986 | Germany . |
| 261868 | 11/1988 | Germany . |
| 49-97846 | 8/1974 | Japan . |
| 50-100596 | 8/1975 | Japan . |
| 53-33389 | 3/1978 | Japan . |
| 53-133799 | 11/1978 | Japan . |
| 54-24811 | 2/1979 | Japan . |
| 55-160072 | 12/1980 | Japan . |
| 56-32605 | 4/1981 | Japan . |
| 57-113505 | 7/1982 | Japan . |
| 57-208002 | 12/1982 | Japan . |
| 58-42651 | 3/1983 | Japan . |
| 58-61144 | 4/1983 | Japan . |
| 58-104969 | 6/1983 | Japan . |
| 58-127742 | 7/1983 | Japan . |
| 59-49272 | 3/1984 | Japan . |
| 59-100176 | 6/1984 | Japan . |
| 59-166542 | 9/1984 | Japan . |

(List continued on next page.)

| | | |
|---|---|---|
| WO 89/11209 | 11/1989 | WIPO . |

OTHER PUBLICATIONS

Feeley, Berbst & Schmeckenbecher, Conductive Pasts, IBM Technical Disclosure Bulletin, Dec. 1968.

"Electricity–Carrying Ink Used in Circuit Boards" Wall Street Journal (Sep. 28, 1988).

"Prototype Tool Turns Out Multilevel Circuit Boards" Electronic Design (May 25, 1989).

Gallagher et al., Abstract "Transient Liquid Phase Sintering Conductive Adhesives" 568–573 (1995).

Lee et al "Organic Acids ad Acid Anhydrides as Curing Agents" Epoxy Resins, McGraw–Hill Book Co, 1957 (No Month) pp. 115–124.

Primary Examiner—Mark Kopec
Attorney, Agent, or Firm—Gray, Cary, Ware & Freidenrich; Stephen E. Reiter; Ramsey R. Stewart

[57] ABSTRACT

An inventive method for electrical and thermal electronic component attachment is disclosed. The combination of transient liquid phase sintering (TLPS) and a permanent adhesive flux binder provides the advantages of both conventional soldering technology and conductive adhesives. This hybrid approach delivers electrical and thermal conduction through sintered metal joints and mechanical properties based on a tailorable polymer matrix. These transient liquid phase sintering conductive adhesives can utilize conventional dispensing, placement, and processing equipment. During the reflow process, metal powders in the composition undergo interparticle sintering as well as alloying to the contact pads. This process produces a strong mechanical, thermal, and electrical interconnect which ensures good conductivity that is also resistant to humidity and temperature cycling.

20 Claims, 3 Drawing Sheets

U.S. PATENT DOCUMENTS

| | | | |
|---|---|---|---|
| 3,502,609 | 3/1970 | Barie et al. | 260/37 |
| 3,679,439 | 7/1972 | Milgram | 252/514 |
| 3,681,135 | 8/1972 | Graham | 106/1 |
| 3,714,709 | 2/1973 | Liederbach | 29/626 |
| 3,791,027 | 2/1974 | Angelo et al. | 148/23 |
| 3,800,020 | 3/1974 | Parfet | 264/104 |
| 3,801,364 | 4/1974 | Kojina et al. | 117/212 |
| 3,808,046 | 4/1974 | Davey | 252/512 |
| 3,857,798 | 12/1974 | Wall et al. | 252/514 |
| 3,904,555 | 9/1975 | Matsuda et al. | 252/514 |
| 3,960,777 | 6/1976 | Coyle | 252/514 |
| 3,983,075 | 9/1976 | Marshall et al. | 252/511 |
| 4,000,016 | 12/1976 | Lazzarini et al. | 148/23 |
| 4,001,146 | 1/1977 | Horowitz | 252/514 |
| 4,127,699 | 11/1978 | Aumiller et al. | 428/461 |
| 4,147,669 | 4/1979 | Shaheen et al. | 252/512 |
| 4,186,036 | 1/1980 | Elms et al. | 427/386 |
| 4,233,103 | 11/1980 | Shaheen | 156/331 |
| 4,273,593 | 6/1981 | Mastrangelo | 148/24 |
| 4,278,702 | 7/1981 | Jenq | 427/96 |
| 4,293,451 | 10/1981 | Ross | 252/512 |
| 4,327,124 | 4/1982 | Desmarais, Jr. | 427/96 |
| 4,352,899 | 10/1982 | Tada et al. | 523/451 |
| 4,353,816 | 10/1982 | Iwasa | 252/512 |
| 4,368,281 | 1/1983 | Brummett et al. | 523/458 |
| 4,396,666 | 8/1983 | Ernsberger | 428/208 |
| 4,400,214 | 8/1983 | Ogawa et al. | 252/512 |
| 4,415,486 | 11/1983 | Boonstra et al. | 252/514 |
| 4,429,657 | 2/1984 | Desmarais, Jr. | 118/114 |
| 4,434,084 | 2/1984 | Hcks et al. | 252/512 |
| 4,457,861 | 7/1984 | Desmarais, Jr. | 252/514 |
| 4,459,166 | 7/1984 | Dietz et al. | 156/89 |
| 4,496,475 | 1/1985 | Abrams | 252/514 |
| 4,533,685 | 8/1985 | Hudgin et al. | 523/457 |
| 4,557,857 | 12/1985 | Soresen | 252/503 |
| 4,564,563 | 1/1986 | Martin et al. | 252/511 |
| 4,575,432 | 3/1986 | Lin et al. | 428/456 |
| 4,578,425 | 3/1986 | Santorelli | 525/109 |
| 4,581,158 | 4/1986 | Lin | 252/511 |
| 4,592,861 | 6/1986 | Bekele et al. | 252/511 |
| 4,639,396 | 1/1987 | Semsarzadeh | 428/373 |
| 4,652,398 | 3/1987 | Goswami et al. | 252/514 |
| 4,673,532 | 6/1987 | Barajas et al. | 252/512 |
| 4,678,602 | 7/1987 | Tanaka et al. | 252/513 |
| 4,680,141 | 7/1987 | Barajas | 252/512 |
| 4,683,653 | 8/1987 | Iwasa | 29/830 |
| 4,696,764 | 9/1987 | Yamazaki | 252/503 |
| 4,705,647 | 11/1987 | Yamaguchi et al. | 252/512 |
| 4,731,130 | 3/1988 | O'Leary | 148/24 |
| 4,732,702 | 3/1988 | Yamazaki et al. | 252/512 |
| 4,733,018 | 3/1988 | Prabhu et al. | 174/68.5 |
| 4,740,252 | 4/1988 | Hasagawa et al. | 148/24 |
| 4,756,756 | 7/1988 | Cassat | 106/20 |
| 4,765,929 | 8/1988 | Shaffer | 252/511 |
| 4,775,500 | 10/1988 | Funakoshi et al. | 264/22 |
| 4,780,371 | 10/1988 | Joseph et al. | 523/457 |
| 4,786,437 | 11/1988 | Ehrreich | 252/506 |
| 4,789,411 | 12/1988 | Eguchi et al. | 148/24 |
| 4,803,543 | 2/1989 | Inayoshi et al. | 357/22 |
| 4,808,434 | 2/1989 | Bennett et al. | 427/96 |
| 4,816,184 | 3/1989 | Fukuda et al. | 252/511 |
| 4,820,446 | 4/1989 | Prud'homme | 252/511 |
| 4,830,779 | 5/1989 | Maeno et al. | 252/512 |
| 4,836,955 | 6/1989 | Ehrreich | 252/512 |
| 4,859,268 | 8/1989 | Joseph et al. | 156/275.5 |
| 4,872,928 | 10/1989 | Jacobs | 148/24 |
| 4,874,548 | 10/1989 | Hajovsky | 252/511 |
| 4,880,570 | 11/1989 | Sanborn et al. | 252/512 |
| 4,882,227 | 11/1989 | Iwase et al. | 428/407 |
| 4,888,135 | 12/1989 | Tsunaga et al. | 252/512 |
| 4,894,184 | 1/1990 | Fukuoka et al. | 252/512 |
| 4,940,498 | 7/1990 | Rubin | 148/23 |
| 4,971,727 | 11/1990 | Takahashi et al. | 252/511 |
| 4,996,005 | 2/1991 | Saito et al. | 252/512 |
| 5,088,189 | 2/1992 | Brown | 29/840 |
| 5,136,365 | 8/1992 | Pennisi et al. | 357/72 |
| 5,376,403 | 12/1994 | Capote et al. | 427/96 |
| 5,463,190 | 10/1995 | Carson et al. | 174/259 |

FOREIGN PATENT DOCUMENTS

| | | |
|---|---|---|
| 60-149670 | 8/1985 | Japan . |
| 60-243171 | 12/1985 | Japan . |
| 60-245742 | 12/1985 | Japan . |
| 61-57660 | 3/1986 | Japan . |
| 61-261375 | 11/1986 | Japan . |
| 61-287974 | 12/1986 | Japan . |
| 62-156176 | 7/1987 | Japan . |
| 62-160603 | 7/1987 | Japan . |
| 63-39947 | 2/1988 | Japan . |
| 63-81185 | 4/1988 | Japan . |
| 63-125582 | 5/1988 | Japan . |
| 63-223072 | 9/1988 | Japan . |
| 63-235369 | 9/1988 | Japan . |
| 63-277279 | 11/1988 | Japan . |
| 63-298908 | 12/1988 | Japan . |
| 63-301405 | 12/1988 | Japan . |
| 64-81866 | 3/1989 | Japan . |
| 1-132652 | 5/1989 | Japan . |
| 1-204966 | 8/1989 | Japan . |
| 2-66802 | 3/1990 | Japan . |
| 2-66803 | 3/1990 | Japan . |
| 134737 | 3/1960 | U.S.S.R. . |
| 1455513 | 2/1974 | United Kingdom . |
| 2054277 | 6/1980 | United Kingdom . |

TRANSIENT LIQUID PHASE SINTERING CONDUCTIVE ADHESIVES

RELATED APPLICATIONS

This application is a continuation-in-part of Ser. No. 08/483,079, filed Jun. 7, 1995, now U.S. Pat No. 5,716,663, which is a continuation-in-part of Ser. No. 08/324,060, filed Oct. 17, 1994, now pending, which is a divisional of Ser. No. 07/769,892, filed Oct. 1, 1991, now U.S. Pat. No. 5,376,403, which was a continuation-in-part of Ser. No. 07/477,678, filed Feb. 9, 1990, now abandoned, the entire contents of each of which are hereby incorporated by reference herein.

FIELD OF THE INVENTION

The present invention relates to adhesive formulations. In a particular aspect, the present invention relates to conductive adhesives. In another aspect, the present invention relates to methods for making and methods for using such adhesive materials.

BACKGROUND OF THE INVENTION

A considerable amount of prior art has addressed conductive adhesives as solder replacements in electronic component attachment. The primary advantage of conductive adhesives is the separation of electrical and mechanical characteristics which allows each to be tailored to the application at hand. They also provide a number of advantages from the standpoint of both environmental impact and performance characteristics. From the environmental standpoint, conductive adhesives provide a lead-free alternative to conventional electronic solders. In addition, many do not require extensive pre-cleaning of the metal surfaces to be electrically and mechanically joined, thus eliminating the need for cleaning steps and the resulting residues. Conductive adhesives can allow for lower temperature processing, wider process latitude and finer pitch; while lower levels of residuals cause fewer surface insulation resistance failures. This allows for higher density, better reliability and compatibility with sensitive components.

Most of electronic component assembly today is done using solder. A solder joint is a monolithic metallurgical structure consisting of laminar interfaces of intermetallic formed with the copper circuit pads and lead-rich tin phases which wet the component leads. In order for the solder to form the connection to the pad, a clean metal surface is required. Cleaning of the metal surfaces is generally performed by a flux that strips away the surface oxides. The flux is applied independently or within a solder paste. Afterwards, it may be necessary to clean the flux residues or they need to become inert as is the case with no-clean fluxes and pastes. Although the metallurgical joint can provide a reliable interconnection, the intermetallic and alloy phases of the solder joint are not well matched to the coefficient of thermal expansion of the printed circuit board or the component. This results in high thermal expansion mismatch stresses being developed. Repeated thermal cycling can cause microstructural coarsening resulting in creep rupture, while a continuous intermetallic layer can cause fracture of the stressed solder joints resulting in both electrical and mechanical failure.

Particularly in applications requiring thermal conductivity, although a metallurgical joint can provide a reliable interconnection, conductive adhesives are most often used to connect both printed circuit boards and components to heat sinks. This is because welding a component to a heat sink generally requires high temperatures, and the surfaces to be joined must be wettable by the soldering material for adhesion to occur. One of the advantages of conductive adhesives is that they do not need a solderable surface for joint formation. Also, adhesives generally need less stringent processing parameters.

Most prior art thermally conductive adhesive compositions are based on thermosetting or thermoplastic resins. Thermal conductivity (k) of pure polymer adhesives is poor. Typical values are in the range of 0.2 to 0.3 W/m °K. To increase the thermal conductivity of polymer adhesives, filler particles are added to produce thermally conductive compositions. There are a variety of filler materials detailed in the prior art that can increase the thermal conductivity of a polymer adhesive. These include electrically conducting as well as insulating materials such as various ceramics ($Al_2O_3$, AlN, and BN), metals and diamond.

A limitation of all prior art thermally conductive adhesives is that the thermal conduction is achieved through fillers with high bulk thermal conductivity, but which have only a few contacts with other similar particles. There is an average of only 1.5 contacts per particle at the percolation threshold of an adhesive. Even with more contacts per particle, the area of these contacts is rather small, making it difficult to transfer heat. It is, in fact, easier to transfer electrons across these small contact points, which is why electrical conductivity is not necessarily a good predictor of thermal conductivity in these types of compositions.

The primary deficiency that this passive loading of particles in prior art conductive adhesives causes is instability of the thermal conduction due to temperature and humidity fluctuations. Such fluctuations can cause loss of contact of the thermally conductive fillers due to expansion of the polymer under thermal cycling. Some prior art adhesives rely on polymer shrinkage during cure to mitigate this deficiency, but this technique is only partially successful. Swelling due to moisture absorption and/or elevated temperatures is still possible in such formulations resulting in a decreased number of contacts or loss of contact altogether.

Like the prior art thermally conducting adhesives, most prior art electrically conductive adhesive compositions are thermosetting or thermoplastic resins loaded with fillers, in this case metals or metal coated particles, which provide conduction through contact. These adhesives can be isotropic or anisotropic. Although prior art electrically conductive adhesives do not have the shear strengths that solders have, they do have sufficient strength to serve as a joining material and their adhesion can be reliable after thermal aging and cycling. The primary deficiency in these prior art electrically conductive compositions is that temperature and humidity fluctuations can cause loss of continuity due to oxidation of the contact pads and/or expansion of the polymer. In such a composition, mechanical integrity does not ensure electrical integrity. In addition, although no metallurgical connection is formed, many such formulations still require a pre-cleaning or non-oxidizable metal coating on the surface of the metal pad to be joined.

A number of methodologies have been described in the prior art which mitigate the above-described shortcomings, at least to some extent; however, fundamental deficiencies still remain. These include the incorporation of hard conductive particles to penetrate the oxide surfaces on the pad and adjacent particles, metal coated polymer beads which can be compressed and therefore attain a gas impermeable pressure connection maintained by the cured polymer, and acid-anhydride curing agents which serve to clean the copper pads. Encapsulants have also been used to prevent the post-joining oxidation of the metal surfaces as well as ensure that no silver migration occurs; however, this adds additional processing and expense and only slows the oxidation process without eliminating it. Although the composite nature of conductive adhesives allows them to be tailored for optimum mechanical and electrical performance, robust mechanical characteristics have been achieved at the expense of reliable electrical conductivity that only an actual metallurgical or chemical bond can achieve.

Accordingly, there is still a need in the art for conductive adhesive compositions which satisfy a variety of performance properties. Thus, desirable compositions will possess robust mechanical characteristics and provide reliable electrical conductivity. In addition, such compositions will retain substantially no corrosive residues after processing, require no pre-cleaning of the surfaces to be joined, retain good mechanical and electrical stabilities at temperatures well beyond the original process temperature, be environmentally stable (e.g., resistant to degradation in humid environments), and provide excellent dimensional control to the final cured composition (due to the metal network formed during processing of the composition).

BRIEF DESCRIPTION OF THE INVENTION

The inventive conductive compositions described herein may be employed to attach electronic components to printed wiring boards. In this application, the compositions make an excellent replacement for heretofore known solder pastes and conductive adhesives. The conductive compositions may be stencil or screen printed onto the pads of a printed wiring board, multichip module, etc. in a manner known to those skilled in the art. The electronic components are then placed on the conductive composition and the entire assembly is cured.

In comparison to solder pastes, like some prior art conductive adhesive formulations, the inventive compositions advantageously eliminate the need for cleaning the printed circuit assembly after curing. Moreover, the formulations of the inventive compositions are such that common problems with solder pastes, such as solder balling, bridging and component tombstoning, are eliminated.

The inventive concept is a hybrid of solder and conductive adhesive joining technologies. Electrical connection is established through a plurality of metallurgical connections formed in situ from powders of a high melting point metal and a low melting point alloy in an adhesive-flux polymer binder. The binder fluxes both the metal powders and the metals to be joined, thus allowing an interparticle and particle to surface metallurgical network to be formed through a process known as transient liquid phase sintering. The binder then serves to form the mechanical connection and can be tailored to impart durability to the composite in the face of impact and thermal expansion mismatch stresses.

The multiple redundancy of metallurgically connected electrical pathways provides a robust interconnection that is highly resistant to mechano-thermo-oxidative degradation. This approach is a natural extension of the transient liquid phase sintered conductive inks for which the current invention is a continuation in part.

BRIEF DESCRIPTION OF THE FIGURES

FIG. 1 is a conceptual depiction of a cross-section of a microstructure formed using a conductive adhesive according to the present invention, prior to sintering thereof. Thus, the figure illustrates a cross-section of a joint made between a metal contact pad (45) and a metal component lead (40). This structure illustrates the wide particle size distribution achieved in the practice of the present invention, as well as desirable use of spherical particles (as opposed to flakes). It can also be seen that relatively similar quantities of low melting point metal particles (50) and high melting point particles (55) are desirably employed. Polymer binder (60) are dispersed throughout.

DETAILED DESCRIPTION OF THE INVENTION

Sintering is a process wherein adjacent surfaces of metal powder particles are bonded by heating. Liquid phase sintering is a special form of sintering wherein the solid powder particles coexist with a liquid phase. Densification and homogenization of the mixture occur as the metals diffuse into one another and form an alloy.

In transient liquid phase sintering (TLPS) of powders, the liquid only exists for a short period of time as a result of the homogenization of the metals to form a solid alloy. Two or more powders of different metals are selected which exhibit a eutectic point or melt at some composition and at some temperature $T_1$. A mixture of the two metal powders is prepared in the proportion of the desired final alloy composition, the final composition being a solid at $T_1$. Heating of the mixture to $T_1$ results in the formation of a liquid phase. The liquid phase has a very high solubility in the surrounding solid phase, thus diffusing rapidly into the solid and eventually solidifying at temperature $T_1$. Diffusional homogenization creates the alloy of the final composition without the need to heat the mixture above its equilibrium melting point.

Figure 3:
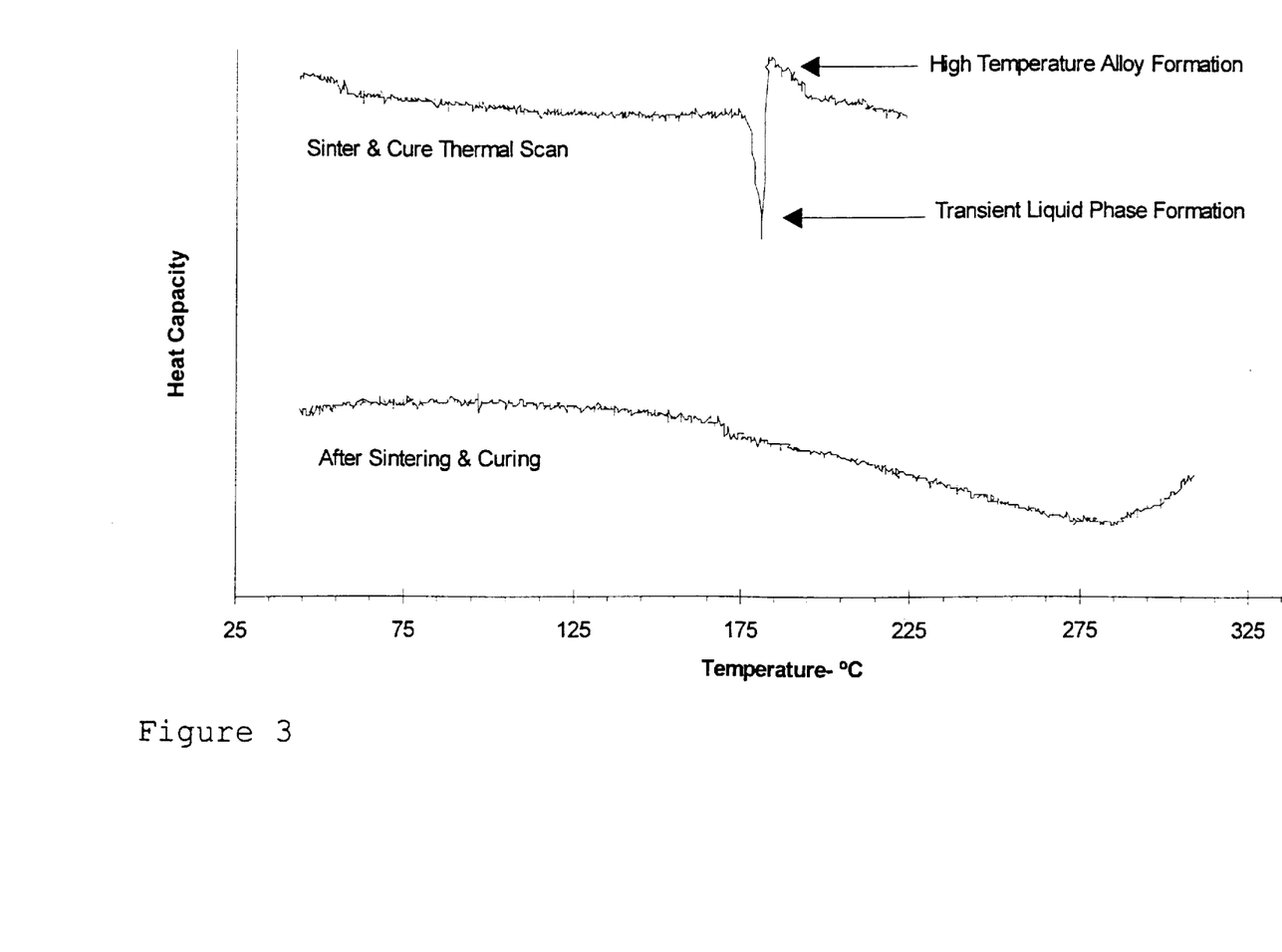
FIG. 3 shows a dual differential scanning calorimetry scan which is typical of conductive adhesives according to the invention. The characteristic sintering and alloying reactions can be seen in the upper scan. The lower scan illustrates the thermal stability of the material after the initial alloying process.

With powder metallurgy, the formation of a transient liquid phase alloy is characterized by a powder mixture which melts at some temperature $T_1$. This has been observed in numerous metal mixtures. As the temperature is raised for the first time, the mixture undergoes a melt endotherm which is followed shortly thereafter by an alloying reaction exotherm. After cooling, subsequent temperature excursions, even beyond the original melt temperatures, do not produce melting anew. This is the signature of a typical low temperature transient liquid phase sintered metal mixture. This characteristic of a TLPS system is illustrated by the dual differential scanning calorimetry scan depicted in FIG. 3.

TLPS is used according to the invention to produce organo-metallic conductive inks which comprise a high melting point metal powder, a low melting point metal alloy powder and a permanent adhesive-flux polymer system.

TLPS inks are employed in forming conductive paths on printed circuits by creating a patterned deposition of the ink mixture and then simultaneously sintering and curing the composition at relatively low temperature. During heating, the adhesive-flux polymer fluxes the metal powders, enabling TLPS to occur. After heating, the adhesive-flux chemically binds the resultant metal oxides, rendering them harmless. For this reason, these inks provide good electrical conductivity with little opportunity for conductivity deterioration due to oxidation, corrosion or thermal expansion and contraction.

Since the mechanical demands on conductive adhesives are more rigorous than for conductive inks, special consideration must be given to the mechanical characteristics of the overall composite structure. In addition, a solvent-free composition is desirable in order to prevent the possibility of joint failure due to outgassing of entrapped solvent during processing or subsequent thermal cycling. Further desirable characteristics of compositions employed as conductive adhesives include wettability of the pads and components, good print resolution, appropriate rheology, good tack, formation of a stable conductive network, adequate adhesion to a variety of materials, reworkability, and the like.

In general terms, the electrically conductive adhesive compositions comprise two primary components: a low melting point metal or metal alloy powder and a cross-linking agent mixture comprising a protected curing agent, which also acts as a primary fluxing agent. Depending upon the intended end use, preferred compositions of the invention contain three or more of the following:

(1) A high melting point metal or metal alloy powder;

(2) A low melting point metal or metal alloy powder (solder);

(3) Optionally, a resin;

(4) A cross-linking agent mixture comprising a protected curing agent, which also acts as a primary fluxing agent;

(5) Optionally, a reactive monomer or polymer which can be cross-linked by the curing agent (hereinafter referred to as the "monomer"); and (6) Optionally, a metal additive.

Compositions according to the invention can also contain other additives to improve certain properties thereof, such as adhesion, rheology, solderability, and the like. The composition must either contain (3) and/or (5), or alternatively (3) and/or (5) may be combined with (4) into a single species, as in the case of a protected homopolymerizable resin.

In preparing invention compositions, the proportions of components (1)–(6) may be varied over a considerable range and once cured still yield an electrically and thermally conductive material.

Generally, invention compositions, after curing, have a bulk electrical resistivity of less than $10^{-3}$ Ohm-cm. This electrical conductivity range can be satisfied by numerous formulations having components (1)–(6) within the following ranges:

Component (1): 5–65% of the volume of the composition;
Component (2): 5–60% by volume of the composition;
Component (3): 0–35% by volume;
Component (4): 2–60% by volume;
Component (5): 0–35% by volume; and
Component (6): 0–10% by volume.

Preferably, invention compositions have a bulk electrical resistivity of $5\times10^{-5}$ Ohm-cm or less. This characteristic can be satisfied by numerous formulations having components (1)–(6) within the following ranges:

Component (1): 8–60% by volume of the composition;
Component (2): 6–40% by volume of the composition;
Component (3): 0–12% by volume;
Component (4): 7–50% by volume;
Component (5): 0–28% by volume; and
Component (6): 0–5% by volume.

In a preferred embodiment of the invention, the metal additive (i.e., component (6)) is present in an amount falling in the range of about 0.1 up to about 5% by volume. When the metal additive is a required component of invention composition, the combined volume percent of the high melting point metal, the low melting point metal or metal alloy, and the metal additive preferably falls in the range of about 14 up to about 75 volume percent, based on the total volume of the composition. In such formulations, it is preferred that:

the volume percent of the chemically protected crosslinking agent fall in the range of 5 up to about 55 volume percent, the volume percent of the resin fall in the range of 3 up to about 30 volume percent, and the volume percent of the reactive monomer or polymer fall in the range of 3 up to about 30 volume percent.

In such formulations, it is especially preferred that the combined volume percent for the resin plus the reactive monomer (or polymer) fall in the range of about 5 up to about 50 volume percent.

In another preferred embodiment of the present invention, the resin (i.e., component (3)) is present in an amount falling in the range of about 3 up to about 35% by volume. When the resin is a required component of invention adhesive composition, it is preferred that the volume ratio of the combined volume of the resin (plus the reactive monomer or polymer, when present), relative to the volume of the chemically protected crosslinking agent, fall in the range of about 0.1 up to about 10.

In yet another preferred embodiment of the present invention, reactive monomer or polymer (i.e., component (5)) is present in an amount falling in the range of about 3 up to about 35% by volume. When the reactive monomer or polymer is a required component of invention adhesive compositions, it is preferred that the volume ratio of the combined volume of the reactive monomer or polymer (plus the resin, when present), relative to the volume of the chemically protected crosslinking agent, fall in the range of about 0.1 up to about 10.

Typically, high melting point metal powders (i.e., component (1)) employed in the practice of the present invention are selected from copper powder, silver powder, aluminum powder, gold powder, platinum powder, palladium powder, beryllium powder, rhodium powder, nickel powder, cobalt powder, iron powder, molybdenum powder, as well as high-melting point alloys of any two or more of these metals, may be employed. The preferred high melting point metal contemplated for use herein is copper powder, especially copper powder which is spherical or nearly spherical, as produced by gas atomization. Electrolytic powders or flakes, while recommended for use in the prior art for the preparation of conductive adhesives, are not desirable for use in the practice of the present invention. Irregularly-shaped powder particles tend to be sponge-like in morphology, substantially increasing the oxidized surface area, compared to the oxidized surface area of spherical particles.

A spherical powder containing a wide distribution of particle sizes distributed approximately normally about an average particle diameter is preferred over monosized spheres. The wide distribution of sizes increases the density of the packed metal powder as compared to monosized spheres, improving electrical conductivity and mechanical integrity. Metal powders employed in the practice of the present invention generally have an average particle diameter of about 0.5 up to 100 microns. Preferred powders contemplated for use herein have a mean particle diameter of about 0.5 up to 50 microns.

Solder powders contemplated for use in the practice of the present invention include Sn, Bi, Pb, Cd, Zn, Ga, In, Te, Hg, Tl, Sb, Se, Po, or mixtures of any two or more thereof, or another metal or alloy having a melting point lower than that of the metal powder in component (1). Typically, the powder has a mean particle diameter in the range of about 0.25 up to about 100 microns. Preferably, the average particle diameter is less than or equal to the average diameter of the high melting point metal particles and the particle size distribution is substantially the same as that of the high melting point metal powder. The principal requirement of the alloy is that it melt and flow prior to the vitrification of the polymers in the composition. In order for this to occur, the solder alloy must readily wet the high melting point metal (1). For this reason, alloys of tin are preferable.

The resin functions principally to adhere the cured composition to the substrate, to provide chemical binding sites for the reaction products after curing, and to increase the cohesive strength of the cured composition. The resin also functions as a medium for delivering flux to the metal powder, as a thickening binder for the composition. In order for the composition to achieve the highest electrical and thermal conductivity, it must achieve and maintain low viscosity up to the temperature at which the solder powder melts and wets the high melting point metal (1). If the resin becomes too viscous before the solder powder has melted, it will impede the flow of the melt and reduce the degree of metal powder sintering. For this reason, the curing of the resin must occur slowly relative to the time required to reach the melting point of the solder powder.

Resins contemplated for use in the practice of the present invention include any thermosetting resin (either monomeric or polymeric) which can be cross-linked by the curing agent, a metal catalyst or a hydroxyl group-bearing agent. Resins which meet this requirement include epoxies, phenolics, novalacs (both phenolic and cresolic), polyurethanes, polyimides, bismaleimides, maleimides, cyanate esters, polyvinyl alcohols, polyesters, polyureas, and the like. Other resin systems may be modified to be cross-linkable by the curing agent, a metal catalyst or a hydroxyl group-bearing agent. Examples of such resins are acrylics, rubbers (butyl, nitrile, etc), polyamides, polyacrylates, polyethers, polysulfones, polyethylenes, polypropylenes, polysiloxanes, polyvinyl acetates/polyvinyl esters, polyolefins, cyanoacrylates, polystyrenes, and the like. Presently preferred resins contemplated for use in the practice of the present invention include epoxies, phenolics, novalacs (both phenolic and cresolic), polyurethanes, polyimides, maleimides, cyanate esters, polyvinyl alcohols, polyesters, polyureas, acrylics, polyamides, polyacrylates, polysiloxanes, cyanoacrylates, and the like. Especially preferred resins contemplated for use in the practice of the present invention include epoxies, phenolics, novalacs (both phenolic and cresolic), polyimides, maleimides, cyanate esters, polyesters, polyamides, polysiloxanes, and the like.

Typically, any resin would function in this invention if the resin can be modified to contain at least one of the following functional groups: anhydrides, carboxylic acids, amides, imides, amines, alcohols/phenols, aldehydes/ketones, nitro compounds, nitriles, carbamates, isocyanates, amino acids/peptides, thiols, sulfonamides, semicarbazones, oximes, hydrazones, cyanohydrins, ureas, phosphoric esters/acids, thiophosphoric esters/acids, phosphonic esters/acids, phosphites, phosphonamides, sulfonic esters/acids or other functional groups known to those of skill in the art to act as reactive sites for polymerization. For example, a polyolefin would not be suitable as a resin in the practice of the present invention, as it has no reactive sites for binding and has poor adhesive properties; however, a carboxylated polyolefin would function well when matched with a suitable cross-linking agent. A combination of these and other resins, such as non-cross-linkable thermoplastic resins, may also be used as the resin component. A multifunctional epoxy resin, combined with a phenolic novolac resin is presently preferred.

The principal feature of the cross-linking agent is that in its unprotected form it acts as an acid or a strong base. Most acids and strong bases function well as fluxing agents, because they can remove oxides from metals. However, if they are left in their reactive form in the composition, they would prematurely promote cross-linking of the resin or be consumed in reactions with the metal powders. The principal property of a protected curing agent employed in the practice of the present invention is that it remain largely unreactive until it is needed to flux the metal powder and cross-link the resin. Protection may be achieved by chemically binding the agent with a chemically- or thermally-triggered species so that it becomes reactive only at or near the time that the solder powder melts. Protection may also be achieved mechanically, for example by encapsulating the curing agent in a shell of non-reactive material which releases the curing agent only at or near the melting time of the solder powder.

Cross-linking agents contemplated for use in the practice of the present invention are well known in the art and can be readily identified by those of skill in the art. Thus, any agent which can promote curing of polymers and which is acidic or strongly basic can be employed in the practice of the present invention. Such agents include compounds bearing one or more functional groups selected from anhydride groups, carboxyl groups, amide groups, imide groups, amine groups, hydroxyl groups, phenolic groups, aldehyde groups, keto groups, nitro groups, nitrile groups, carbamate groups, isocyanate groups, amino acids/peptides, thiol groups, sulfonamide groups, semicarbazone groups, oxime groups, hydrazone groups, cyanohydrin groups, ureas, phosphoric esters/acids, thiophosphoric esters/acids, phosphonic esters/acids, phosphite groups, phosphonamide groups, and the like. Presently preferred compounds contemplated for use in the practice of the present invention are compounds bearing one or more functional groups selected from carboxyl, hydroxyl, amine, thiol or cyano groups, or derivatives thereof. Especially preferred crosslinking agents contemplated for use herein comprise at least two functionalities selected from anhydride, carboxyl, amine, amide, hydroxyl or cyano.

Exemplary chemically protected crosslinking agents contemplated for use in the practice of the present invention include anhydrides, carboxylic acids, amides, imides, amines, alcohols, phenols, isocyanates, cyanate esters, thiols, and the like.

Protecting groups are generally specific to the curing agent employed and are not generally applicable to all curing agents. Typical protecting groups include carboxylic acids, amides, alcohols, alkyl halides, acid halides, thiols, ureas, alkyl silanes, diazoalkanes, olefins, amines, amine-ols, diamine polyols, and the like. In addition, curing agents may be protected by formation of azomethanes, acetals, ketals, transition metal complexes or other curing agent precursors. There exist many such protecting groups and complexes specific to the curing agents being protected.

A presently preferred cross-linking agent contemplated for use in the practice of the present invention comprises a mixture containing a mono- or polyanhydride. It is of particular importance that the majority of the anhydride be protected from reacting with the resin component and both the high melting and low melting metal powders until the flow temperature of the low melting metal powder is reached. This can be accomplished, for example, by chemically binding a protecting or inhibiting group to the anhydride. The protecting group is preferably selected so that the protected anhydride becomes reactive at elevated temperature. An example of a method of protecting the anhydride is to esterify it with an alcohol or polyol to form the mono-ester/acid and its derivatives, as follows:

Butyl carbitol, methanol, ethylene glycol, glycerol, meso-erythritol, adonitol, and sorbitol are some examples of esterifying alcohols and polyols which can be employed. The resulting mono-ester/acids formed can be further protected by buffering with a base, such as a tertiary amine, at room temperature. In addition, other protecting groups as are well known to those skilled in the art may also be employed.

Glycerol is a preferred esterifying polyol, producing a composition that achieves optimum electrical conductivity at moderate temperatures. The preferred anhydride ester is prepared by heating phthalic anhydride in glycerol at 180°–200° C. in the presence of a trace of acid or water until the concentration of the mono-ester reaches equilibrium. The resulting mixture comprising anhydride, mono ester-mono acid, diacid and other reaction products may then be buffered with a base as described above, or may be directly employed as the cross-linking agent/flux in preferred compositions. A preferred buffering agent is triethanolamine.

It is believed that the esterified anhydrides and buffered esterified anhydrides are chemically triggered at elevated temperatures and/or by interaction with the metal oxides. The anhydride and its protecting groups are selected to chemically attack the oxides on the surface of the metal particles in an aggressive manner, yet remain non-reactive after curing. The metal oxides are apparently chemically immobilized in the resin system after curing, preventing them from forming caustic salts and acids. Through appropriate selection of the cross-linking agent and its protecting group, the aggressiveness of the crosslinking agent in attacking the metal oxides can be tailored to fit both the melting point of the solder component and the type of high melting point metal to be fluxed.

The reactive monomer component of invention compositions functions to adhere the cured composition to the substrate, to provide chemical binding sites for the reaction products after curing and to increase the cohesive strength of the cured composition. It may also serve to slow the curing of the composition, thus maintaining a low-viscosity background medium during curing. The monomer also may function as a medium for delivering flux to the metal powder, as a thickening binder for the composition and as a medium for decreasing the glass transition temperature of the cured composition if desired. When used with a resin (3), the monomer can slow the vitrification of the resin to allow good wetting of the metal powder (1) by the molten metal (2).

Monomers contemplated for use in the practice of the present invention include any species, monomeric or polymeric, which can be cross-linked by the curing agent, a metal catalyst or a hydroxyl group-bearing agent. Generally, they are distinguished from resins by having relatively low molecular weights. The preferred reactive monomer contemplated for use in the practice of the present invention contains at least one functional group, and preferably two or more functional groups, as reactive site(s) for linking with the cross-linking agents and the resin. Typical functional groups include, epoxides, amides, amines, alcohols, allyls, acrylates, methacrylates, cyanate esters, maleimides, and the like. A preferred reactive monomer is a multifunctional epoxy monomer.

The optional metal additive can be added as separate particles, as a coating on the high melting point metal or the low melting point alloy, or pre-alloyed with either the high melting point metal and/or the low melting point alloy. The preferred size of particulate additives is about 0.1 up to about 50 μm. The metal additive can be any metal selected from boron, aluminum, chromium, iron, nickel, zinc, gallium, silver, palladium, platinum, gold, indium, antimony, bismuth, tellurium, manganese, phosphorous, cobalt, copper, and the like. In the conductive compositions described herein, the TLPS reaction allows the high melting point metal and the low melting point metal or alloy to form a metallurgically connected matrix. It is believed that the additive metals alter the grain structure, extent of interdiffusion, and rate of formation of the matrix formed therebetween during processing of the conductive ink compositions. It is further believed these structural alterations provide a wide variety of benefits to the composition for specific applications, such as promoting greater flexibility. Currently preferred metal additives include silver, nickel, gallium and gold.

The conductive adhesives described herein have good rheology and tack, comparable to traditional solder pastes. Stenciling of the adhesive has demonstrated good edge resolution. Additionally, components placed onto the deposited adhesive remain in place even with the test vehicle held vertically.

In accordance with another aspect of the present invention, there are provided methods for attaching discrete electronic components to electrical interconnect substrates. The invention method comprises:

(i) depositing a conductive adhesive composition as described hereinabove onto an electrical interconnect substrate in a desired pattern, (ii) placing discrete electronic components into said conductive adhesive composition, and (iii) subjecting said conductive adhesive composition to conditions suitable to afford an electrically conductive joint between the discrete electronic component and the electrical interconnect substrate.

As readily recognized by those of skill in the art, invention conductive adhesive composition can be applied to the substrate in a variety of ways, e.g., using such well known techniques as ambient or pressure assisted screen printing, stenciling, individual site dispensing or doctor blading, and the like.

Curing conditions contemplated for use in the practice of the invention comprise subjecting the adhesive composition to a temperature above the melting point of the low melting point metal, but in no event is a temperature in excess of ~345° C. (650° F.) employed. Invention compositions are subjected to such curing conditions for a minimum of about 20 seconds, up to several hours, with the range of 1 minute up to about 1 hour being presently preferred. Optionally, an additional post-cure for up to several hours at or below sintering temperature can also be employed.

Some of the cure profiles investigated thus far include IR, vapor phase reflow and forced convection techniques common to surface mount technology. Initial studies indicate that a variety of curing methods and schedules can result in a viable conductive adhesive joint provided that the proposed curing method can raise the temperature of the composition above the melting point of the low melting point metal prior to vitrification of the polymer matrix.

Figure 2:
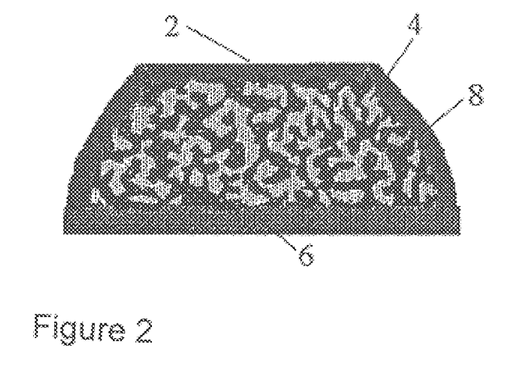
FIG. 2 is a conceptual depiction of a cross-section of the microstructure formed using a TLPS conductive adhesive according to the present invention, after sintering thereof. Thus, the figure shows a cross-section of a joint made between metal contact pad (45) and a metal component lead (40). This sandwich structure demonstrates the composite nature of the adhesive structure after sintering, with areas of continuous metal network (25) as well as areas of cured polymer binder (10) which fills around this network. The formation of a small fillet formed by invention conductive adhesive composition on the component terminal is shown by element (30).

During cure, a small fillet of the conductive adhesive is formed on the package leads and the component terminals (see, for example, element 30 shown in FIG. 2). This is not possible with traditional conductive adhesives where there is no fillet formed. Additionally, the conductive network does exhibit some self-alignment in that it will propagate toward the metal surfaces to be joined. Although it will not bring the component back to the pad as solder joining does, it will extend itself to make the metallurgical connection.

Much of the prior art in the area of conductive adhesives describes suitable formulations for this purpose to be thermosets which, once hardened, are difficult to remove without destroying the printed circuit. In contrast, the compositions described herein may be formulated using resins comprising thermoplastic and thermosetting blends such that the cured compositions may be melted, even after curing, by application of moderate heat. In such applications, the conductive composition may be printed onto the substrate using screen- or stencil-printing as is known to those familiar with the art. The electronic component is then placed on the composition and the assembly is heated in an oven as described previously to achieve transient liquid phase sintering. Alternatively, heat may be applied to the electronic component from above by a hot platen or hot air blower to achieve curing. The resulting bond between component and substrate may be easily detached, if necessary, by application of heat to the die by a hot platen, soldering iron, hot air or any other method known to those skilled in the art. The component may then by pulled away from the melted composition. Removal of the conductive adhesive at various stages of cure is possible. The ease of rework depends on the characteristics of the particular TLPS conductive adhesive. Repair of the inventive compositions is possible using standard solder joint repair techniques.

Figure 1:
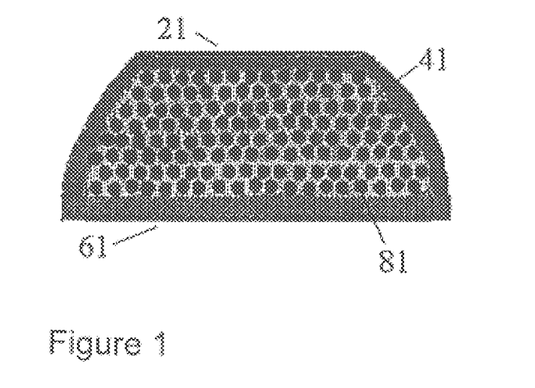

The reader's attention is now directed to FIGS. 1 and 2, which show a cross-section of a joint made between a metal contact pad (45) and a metal component lead (40), before and after sintering, respectively.

The initial (i.e., unsintered) structure set forth in FIG. 1 illustrates the benefits of using a wide particle size distribution of spherical particles (as opposed to flakes). By using relatively equal proportions of low melting point metal particles (50) and high melting point metal particles (55), a fairly homogenous new metal alloy is obtained upon sintering (wherein most of the original metal particles have been consumed, see FIG. 2). Rather than acting as a "glue" for the other components of the composition, the low melting point material substantially diffuses into the high melting point material to create a new alloy (see FIG. 2, element 25).

Thus, FIG. 2 illustrates the composite nature of sintered articles prepared employing the adhesive compositions described herein. It is seen that invention articles, upon sintering have a structure containing areas of continuous metal network (25), as well as areas of polymer binder (10) which fills around this network. Also illustrated is the occurrence of alloying at interfaces (5) and (15). The occurrence of alloying of invention composition to the component lead and/or the contact pad is dependent upon whether these elements are wettable by the low melting point metal powder employed for the preparation of the invention composition utilized. Also illustrated is the formation of a small fillet formed by invention conductive adhesive composition on the component terminal (element 30).

View of a cross-section of an article similar to that depicted in FIG. 2, wherein the copper piece is misaligned with the copper pad reveals that the invention material electrically connects the misaligned copper piece to the copper pad. The network of metallurgy extends itself beyond the pad area and provides the electrical connection to the copper piece placed on top, even when such copper piece is misaligned.

The invention may be better understood by reference to the following examples which are intended for purposes of illustration and are not to be construed as in any way limiting the scope of the present invention which is defined in the claims appended hereto.

EXAMPLE 1

A study was done to determine the thermophysical properties of a TLPS conductive composition for use in thermally efficient packaging. In order to measure the bulk thermal conductivity of the TLPS conductive composition, because of the nature of the measuring apparatus, ten successive layers of the composition were deposited on a 0.5"×0.5" copper piece for a total thickness of 12.5 mils. After measurements of specific heat and thermal diffusivity using the laser flash method, calculations were performed on thermal conductivity of the copper and the TLPS conductive ink. The results were 351 W/m °K for copper and 25.4 W/m °K for the conductive ink.

This good result was attributed to the copper-alloy network which exists in TLPS based organo-metallic systems. These measured values correlate well with the ratio of electrical conductivities of the two materials, which is also about 15:1.

EXAMPLE 2

An experiment was performed to determine the ability of a third metal powder "dopant" to decrease the susceptibility of TLPS compositions to forming microcracks during thermal cycling. Several formulations were made from a master pre-mixture containing (by volume):

40% copper powder,

15% eutectic composition tin-lead alloy powder, 16.25% phenolic monomer,

20% ester/acid oligomer buffered by triethanolamine, 4.375% aniline based tetrafunctional epoxy, 4.375% Novolac epoxy, and solvent. To several splits of this pre-mixture were added a variety of "dopant" metal powders at a level of 3–6% by weight of the total metal content. The splits containing the various dopant materials were screen printed in a serpentine pattern of 8, 10 and 12 mil lines. Each of the lines had a total length of 90 inches. The screen printed patterns were cured under standard conditions for such conductive compositions and were then subsequently cycled 5 times to 215° C. for 2 minutes. The number of resultant cracks in each sample were counted under backlit magnification. The results are as follows:

| Additive | Level of addition | Numbers of cracks |
| --- | --- | --- |
| silver | 3% | 29 |
| silver | 4.5% | 4 |
| silver + nickel | 6% | >100 |
| nickel | 6% | >100 |
| gallium | 3% | 42 |
| gallium + silver | 6% | 1 |
| aluminum | 3% | >100 |
| aluminum + silver | 6% | >100 |
| boron + silver | 6% | 55 |
| silver coated nickel | 6% | >100 |
| silver coated mica | 6% | 35 |
| aluminum-bronze | 6% | 7 |
| no additive | — | >100 |

The results demonstrate that the additive metal can have a substantial effect on the crack resistance and that of these additives, silver, gallium and bronze are the most useful.

EXAMPLE 3

An experiment was performed in which the anhydride-ester protected curing agent was left out of several formulations and various other constituents were added or increased. The purpose of this experiment was to determine if the roles being played by the ester could be executed as effectively by substitute materials. As the ester is believed to being playing both fluxing and adhesive roles, both flux materials and epoxy constituents were increased to compensate. The experiment and the results are below:

All the samples were prepared using a master metal pre-mixture consisting of 70% by weight copper, 25% by weight eutectic tin-lead alloy and 5% by weight silver. 14.75 grams of the pre-mixture was added to each of the samples.

| Constituent | Std | Sample 1 | Sample 2 | Sample 3 | Sample 4 |
| --- | --- | --- | --- | --- | --- |
| Phenolic monomer, (g) | .60 | .94 | .60 | .60 | .60 |
| Epoxy resin, (g) | .30 | .30 | .30 | .43 | .35 |
| triethanolamine, (g) | .25 | 0 | .25 | .43 | .43 |
| anhydride ester, (g) | .45 | 0 | 0 | 0 | 0 |
| Bulk Resistivity, ($\mu\Omega$ * cm) | 29.1 | off scale | 26.5 | 26.6 | 25.5 |
| Pull Strength (kg/4 mm$^2$) | 4.56 | 0 | .36 | .35 | .25 |

From the above data, it can be seen that the use of a chemically-protected cross-linking agent having at least some fluxing capability (e.g., the ester of an anhydride complexed with a tertiary amine as described hereinabove) is highly effective in facilitating simultaneously achieving good mechanical and electrical characteristics.

EXAMPLE 4

An electrically conductive adhesive composition was prepared with the following volumetric proportions of components:

copper 10.5%, low melting point alloy 13.5%, epoxy resin 14.0%, anhydride monoesters 45.0%, reactive monomers 17.0%, and additive metals <1%.

The resulting composition was then stenciled onto copper and tin-coated pads on standard printed circuit boards. Several electronic components with a variety of lead configuration types were then processed at 85° C. for 40 minutes, followed by a 12 minute cycle at 215° C. to effect TLPS and cure the composition.

The completed assemblies were then compared against several commercially available conductive adhesive formulations which had been processed according to the manufacturer's specifications. The test samples for each adhesive were tested for junction resistance. The TLPS adhesive demonstrated junction resistances all in the 1.0±0.2Ω range, whereas the prior art commercially available conductive adhesives all had junction resistances in the 2.0±0.5Ω range. Additionally, the samples were dropped on edge five times from 3 feet, and five times from 7 feet. Only the TLPS conductive adhesive bound components held under such treatment without a single failure.

While the invention has been described in detail with reference to certain preferred embodiments thereof, it will be understood that modifications and variations are within the spirit and scope of that which is described and claimed.

That which is claimed is:

1. A conductive adhesive composition comprising:

in the range of about 5 up to about 65% by volume of a high melting point metal, wherein said metal is in the form of a substantially spherical powder, in the range of about 5 up to about 60% by volume of a low melting point metal or metal alloy, wherein said metal or metal alloy is in the form of a substantially spherical powder, in the range of about 2 up to about 60% by volume of a chemically protected crosslinking agent, wherein said chemically protected crosslinking agent is an acid or strong base which has been chemically modified by the addition of a chemically or thermally triggered species to become reactive only at or near the time the low melting point metal or metal alloy, or an alloy thereof with said high melting point metal melts, in the range of 0 up to about 35% by volume of a resin, in the range of 0 up to about 35% by volume of a reactive monomer or polymer that is not the same as said resin, and in the range of 0 up to about 10% by volume of a metal additive, with the proviso that said composition must contain either said resin and/or said reactive monomer or polymer, or, in the alternative, said resin and/or said reactive monomer or polymer can be combined with said chemically protected crosslinking agent to produce a single component of said composition.

2. A conductive adhesive composition according to claim 1, wherein said composition comprises:

in the range of about 8 up to about 60% by volume of said high melting point metal, in the range of about 6 up to about 40% by volume of said low melting point metal or metal alloy, in the range of about 7 up to about 50% by volume of said chemically protected crosslinking agent, in the range of 0 up to about 12% by volume of said resin, in the range of 0 up to about 28% by volume of said reactive monomer or polymer, and in the range of 0 up to about 5% by volume of said metal additive.

3. A conductive adhesive composition according to claim 1 wherein said metal additive is present in an amount falling in the range of about 0.1 up to about 5% by volume.

4. A conductive adhesive composition according to claim 3, wherein the combined volume percent of said high melting point metal, said low melting point metal or metal alloy, and said metal additive falls in the range of about 14 up to about 75 volume percent, based on the total volume of said composition, and wherein the volume percent of said chemically protected crosslinking agent falls in the range of 5 up to about 55 volume percent, the volume percent of said resin falls in the range of 3 up to about 30 volume percent, and the volume percent of said reactive monomer or polymer falls in the range of 3 up to about 30 volume percent.

5. A conductive adhesive composition according to claim 1 wherein said resin is present in an amount falling in the range of about 3 up to about 35% by volume.

6. A conductive adhesive composition according to claim 5, wherein the volume ratio of the combined volume of said resin, and said reactive monomer or polymer, when present, relative to the volume of the chemically protected crosslinking agent, falls in the range of about 0.1 up to about 10.

7. A conductive adhesive composition according to claim 1 wherein said reactive monomer or polymer is present in an amount falling in the range of about 3 up to about 35% by volume.

8. A conductive adhesive composition according to claim 5, wherein the volume ratio of the combined volume of said reactive monomer or polymer, and said resin, when present, relative to the volume of the chemically protected crosslinking agent, falls in the range of about 0.1 up to about 10.

9. A conductive adhesive composition according to claim 1, wherein said high melting point metal is selected from copper powder, silver powder, aluminum powder, gold powder, platinum powder, palladium powder, beryllium powder, rhodium powder, nickel powder, cobalt powder, iron powder, molybdenum powder, or high-melting point alloys of any two or more of these metals.

10. A conductive adhesive composition according to claim 1, wherein said low melting point metal or metal alloy is any metal or metal alloy having a melting point lower than that of said high melting point metal or metal alloy.

11. A conductive adhesive composition according to claim 10, wherein said low melting point metal or metal alloy is selected from Sn, Bi, Pb, Cd, Zn, Ga, In, Te, Hg, Tl, Sb, Se or Po, or mixtures of any two or more thereof.

12. A conductive adhesive composition according to claim 1, wherein said chemically protected crosslinking agent is a compound bearing one or more functional groups selected from carboxyl, hydroxyl, amine, thiol or cyano groups, or derivatives thereof.

13. A conductive adhesive composition according to claim 1, wherein said chemically protected crosslinking agent is selected from an anhydride, a carboxylic acid, an amide, an imide, an amine, an alcohol, a phenol, an isocyanate, a cyanate ester or a thiol.

14. A conductive adhesive composition according to claim 1, wherein said chemically protected crosslinking agent comprises at least two functionalities selected from anhydride, carboxyl, amine, amide, hydroxyl or cyano.

15. A conductive adhesive composition according to claim 1, wherein said resin is a thermosetting monomer or polymer.

16. A conductive adhesive composition according to claim 1, wherein said resin is selected from an epoxy, a phenolic, a phenolic novalac, a cresolic novalac, a polyurethane, a polyimide, a maleimide, a cyanate ester, a polyvinyl alcohol, a polyester, a polyurea, an acrylic, a polyamide, a polyacrylate, a polysiloxane or a cyanoacrylate.

17. A conductive adhesive composition according to claim 1, wherein said resin is selected from an epoxy, a phenolic, a phenolic novalac, a cresolic novalac, a polyimide, a maleimide, a cyanate ester, a polyester, a polyamide or a polysiloxane.

18. A conductive adhesive composition according to claim 1, wherein said reactive monomer or polymer contains at least one functional group.

19. A conductive adhesive composition according to claim 1, wherein said reactive monomer or polymer contains one or more functional groups selected from epoxides, amides, amines, alcohols, allyls, acrylates, methacrylates, cyanate esters or maleimides.

20. A conductive adhesive composition according to claim 1, wherein said metal additive is selected from boron, aluminum, chromium, iron, nickel, zinc, gallium, silver, palladium, platinum, gold, indium, antimony, bismuth, tellurium, manganese, phosphorous, cobalt or copper.

* * * * *